(12) United States Patent
Chen et al.

(10) Patent No.: US 11,984,414 B2
(45) Date of Patent: May 14, 2024

(54) PACKAGING STRUCTURE WITH ANTENNA AND MANUFACTURING METHOD THEREOF

(71) Applicant: Zhuhai ACCESS Semiconductor Co., Ltd, Guangdong (CN)

(72) Inventors: Xianming Chen, Guangdong (CN); Lei Feng, Guangdong (CN); Wenshi Wang, Guangdong (CN); Benxia Huang, Guangdong (CN)

(73) Assignee: ZHUHAI ACCESS SEMICONDUCTOR CO., LTD, Zhuhai (CN)

( * ) Notice: Subject to any disclaimer, the term of this patent is extended or adjusted under 35 U.S.C. 154(b) by 241 days.

(21) Appl. No.: 17/584,722

(22) Filed: Jan. 26, 2022

(65) Prior Publication Data

US 2022/0254741 A1 Aug. 11, 2022

(30) Foreign Application Priority Data

Feb. 5, 2021 (CN) .......................... 202110158558.2

(51) Int. Cl.
*H01L 23/66* (2006.01)
*H01L 21/56* (2006.01)
*H01Q 1/22* (2006.01)

(52) U.S. Cl.
CPC ............ *H01L 23/66* (2013.01); *H01L 21/561* (2013.01); *H01Q 1/2283* (2013.01); *H01L 2223/6677* (2013.01)

(58) Field of Classification Search
CPC .................. H01L 23/66; H01L 21/561; H01L 2223/6677; H01L 23/3128; H01L 24/16;
(Continued)

(56) References Cited

U.S. PATENT DOCUMENTS

2015/0084194 A1* 3/2015 Molzer ................ H01L 23/481
257/774
2017/0186726 A1 6/2017 Tang et al.
(Continued)

FOREIGN PATENT DOCUMENTS

CN 104798087 A 7/2015
CN 108666300 A 10/2018
(Continued)

OTHER PUBLICATIONS

Chinese Office Action, CN Application No. 2022021102044920 dated Feb. 16, 2022.
(Continued)

*Primary Examiner* — Daniel D Chang
(74) *Attorney, Agent, or Firm* — The Dobrusin Law Firm, P.C.

(57) ABSTRACT

A packaging structure with an antenna and a manufacturing method thereof are disclosed. The packaging structure includes a package, an antenna circuit, an interconnecting circuit, an outer-layer circuit, and a chip. The package is internally packaged with a first conducting through hole column and a second conducting through hole column. The antenna circuit is disposed on a first surface and a sidewall of the package. The interconnecting circuit is packaged in the package, and is connected to the antenna circuit by the first conducting through hole column. The outer-layer circuit is disposed on a second surface of the package, and is connected to the interconnecting circuit by the second conducting through hole column. The outer-layer circuit is further connected to a conductive pin. The chip is packaged in the package, and is connected to the interconnecting circuit or the outer-layer circuit.

14 Claims, 8 Drawing Sheets

(58) Field of Classification Search
CPC ......... H01L 24/19; H01L 24/29; H01L 24/32; H01L 24/73; H01L 24/81; H01L 24/92; H01L 25/0655; H01L 2221/68327; H01L 2221/68345; H01L 2221/68359; H01L 2223/6616; H01L 2224/04105; H01L 2224/16227; H01L 2224/29139; H01L 2224/2919; H01L 2224/32225; H01L 2224/73267; H01L 2224/81005; H01L 2224/92244; H01L 2224/95; H01L 2924/15153; H01L 2924/15321; H01L 21/568; H01L 21/6835; H01L 25/50; H01L 21/56; H01L 23/31; H01L 23/5383; H01L 23/5389; H01Q 1/2283

See application file for complete search history.

(56) References Cited

U.S. PATENT DOCUMENTS

| | | | |
|---|---|---|---|
| 2017/0295643 | A1 | 10/2017 | Suzuki et al. |
| 2020/0020653 | A1 | 1/2020 | Lim et al. |
| 2020/0058606 | A1* | 2/2020 | Tsai ................. H01L 23/481 |
| 2020/0194893 | A1 | 6/2020 | Im |

FOREIGN PATENT DOCUMENTS

| | | | |
|---|---|---|---|
| CN | 109075457 | A | 12/2018 |
| CN | 109244046 | A | 1/2019 |
| CN | 109768031 | Y | 5/2019 |
| CN | 110140255 | A | 8/2019 |
| CN | 110739526 | A | 1/2020 |
| CN | 111326848 | A | 6/2020 |
| CN | 111540689 | Y | 8/2020 |
| CN | 111585002 | A | 8/2020 |
| CN | 112018050 | A | 12/2020 |
| JP | H114117 | A | 1/1999 |
| JP | 2005-005985 | A | 1/2005 |
| JP | 4126664 | B2 | 3/2006 |
| JP | 2012-165329 | A | 8/2012 |
| JP | 2017-191835 | A | 10/2017 |
| JP | 2020-503685 | A | 1/2020 |
| KR | 10-2059814 | B1 | 12/2019 |
| KR | 10-2020-0073572 | A | 6/2020 |
| TW | 201916310 | A | 4/2019 |

OTHER PUBLICATIONS

Chinese First Search, CN Application No. 2021101585582 dated Feb. 2, 2022.

Chinese Supplementary Search, CN Application No. 2021101585582 dated Apr. 18, 2022.

Japanese Search Report, JP Application No. 2022-010949 dated Jan. 26, 2023.

Korean Office Action, KR Application No. 10-2022-0013300 dated Jan. 8, 2024.

Taiwan Office Action, TW Application No. 11120663010 dated Jul. 6, 2022.

Taiwan Search Report, TW Application No. 111101526 dated Jul. 4, 2022.

* cited by examiner

PACKAGING STRUCTURE WITH ANTENNA AND MANUFACTURING METHOD THEREOF

CROSS-REFERENCE TO RELATED APPLICATION

This application is based on and claims the benefit of priority from Chinese Patent Application No. 2021101585582, filed on 5 Feb. 2021, the entirety of which is incorporated by reference herein.

TECHNICAL FIELD

The disclosure relates to the technical field of semiconductor packaging, and in particular to a packaging structure with an antenna and a manufacturing method thereof.

BACKGROUND

With the advancement of technology, antennas for transmitting and receiving radio frequency signals are usually disposed on different parts of a circuit board in a wireless communication device and are interconnected through the wiring of a circuit. However, the antennas and the circuit board may incur separate manufacturing costs, and the installation of discrete antennas can no longer meet the requirements of high integration and miniaturization of electronic devices. Therefore, the antenna packaging technology gradually becomes the focus of the advanced packaging industry.

In current antenna packaging technology, a rewiring layer is usually used on a first surface or a lower surface of a package to form an antenna layer after plastic encapsulation of a chip (including passive components and dies) is completed, or antenna layers are separately located on upper and lower surfaces of a package or a package substrate. In such packaging technology, an antenna layer structure needs to additionally occupy an area originally used for arranging a rewiring layer on a surface of a package or occupy an area on a surface of a package substrate, causing certain limitations to design and manufacturing processes of overall package wiring. The length of an antenna is directly related to signal transmission and reception. Numerous spectrums are used in 5G communication. To meet more antenna configurations, different antenna lengths need to be set. An antenna length determines the thickness of a package dielectric layer, making it impossible for an antenna package to meet the requirements of miniaturization.

In addition, due to the requirements of signal quality and transmission speed, more antennas need to be configured. In existing wireless communication modules, an antenna structure is of a flat type, and the length and width of a substrate are fixed, resulting in a limited space (number of layers) for wiring. As a result, the antenna structure has limited functions and cannot meet the spatial coverage of signals, and signal transmission and reception are affected, making it difficult for the antenna structure to meet the operational requirements of a communication system.

SUMMARY

The disclosure aims to at least resolve one of technical problems existing in the existing technology. For this, the disclosure provides a packaging structure with an antenna and a manufacturing method thereof. Antennas are arranged on a surface and a sidewall of an embedded substrate, so that more and longer antenna circuits can be arranged.

According to a first aspect, a packaging structure with an antenna according to an embodiment of the disclosure includes: a package, internally packaged with a first conducting through hole column and a second conducting through hole column; an antenna circuit, disposed on a first surface and a sidewall of the package; an interconnecting circuit, packaged in the package, and connected to the antenna circuit by the first conducting through hole column; an outer-layer circuit, disposed on a second surface of the package, and connected to the interconnecting circuit by the second conducting through hole column, the outer-layer circuit being further connected to a conductive pin; and a chip, packaged in the package, and connected to the interconnecting circuit or the outer-layer circuit.

The packaging structure with an antenna according to an embodiment of the disclosure at least has the following beneficial effects.

In the disclosure, the antenna circuit is arranged on a surface and a sidewall of the package, so that the wiring space of the package can be fully utilized, which helps to arrange more antenna circuits and extend the length of an antenna, thereby improving the signal transmission quality of the antenna circuit.

According to some embodiments of the disclosure, the antenna circuit located on the sidewall of the package has a step structure.

According to some embodiments of the disclosure, the first conducting through hole column includes a plurality of vertically connected inter-layer through hole columns, and a pad is disposed between two adjacent inter-layer through hole columns.

According to some embodiments of the disclosure, an inner-layer antenna circuit is disposed in the package and is located in the same layer as the pad, and the inner-layer antenna circuit is connected to the corresponding pad.

According to a second aspect, a method for manufacturing a packaging structure with an antenna according to an embodiment of the disclosure including:

providing a bearing plate having a first metal layer, and processing at least one antenna layer on the first metal layer, a first sacrificial metal column and a first conducting through hole column connected to the first metal layer being packaged in the antenna layer;

processing a device encapsulation layer based on the last antenna layer, the device encapsulation layer including an interconnecting circuit, a second conducting through hole column, and a package cavity, the second conducting through hole column being connected to the interconnecting circuit;

packaging a chip in the package cavity, and processing a second metal layer based on the device encapsulation layer;

performing plate separation, processing the first metal layer into a surface antenna circuit, and processing the second metal layer into an outer-layer circuit;

removing the first sacrificial metal column to obtain a groove; processing a sidewall antenna circuit on an inner wall of the groove, the sidewall antenna circuit being connected to the surface antenna circuit;

processing a conductive pin on the outer-layer circuit; and performing cutting along the groove to obtain a package.

The method for manufacturing a packaging structure with an antenna according to an embodiment of the disclosure at least has the following beneficial effects. In the disclosure, the antenna circuit is arranged on a surface and a sidewall of the package, so that the wiring space of the package can be fully utilized, which helps to arrange more antenna circuits and extend the length of an antenna, thereby improving the signal transmission quality of the antenna circuit.

According to some embodiments of the disclosure, the processing at least one antenna layer on the first metal layer includes:

processing a first section of an inter-layer through hole column and a first section of the first sacrificial metal column on the first metal layer through pattern transfer and pattern plating according to means of production to obtain a first semi-finished antenna layer; and laminating the first semi-finished antenna layer to obtain the first antenna layer.

According to some embodiments of the disclosure, the processing at least one antenna layer on the first metal layer further includes:

thinning: thinning the laminated antenna layer to expose a previous section of the inter-layer through hole column and a previous section of the first sacrificial metal column;

patterning: adding a pad on the previous section of the inter-layer through hole column and the previous section of the first sacrificial metal column through pattern transfer, or, adding a pad and an inner-layer antenna circuit on the previous section of the inter-layer through hole column and the previous section of the first sacrificial metal column through pattern transfer, the inner-layer antenna circuit being connected to the corresponding pad;

semi-finished product processing: processing a next section of the inter-layer through hole column and a next section of the first sacrificial metal column based on the pad through pattern transfer and pattern plating according to means of production to obtain a next semi-finished antenna layer;

lamination: laminating the next semi-finished antenna layer; and repeating plate grinding, patterning, semi-finished product processing, and lamination according to means of production until processing of a plurality of antenna layers is completed.

According to some embodiments of the disclosure the processing a device encapsulation layer based on the last antenna layer includes:

thinning the last antenna layer; and processing at least one interconnecting circuit layer on the thinned antenna layer through pattern transfer, pattern plating, and lamination, the interconnecting circuit being located on the interconnecting circuit layer.

According to some embodiments of the disclosure the processing a device encapsulation layer based on the last antenna layer further includes:

processing protective metal on the interconnecting circuit on the last interconnecting circuit layer and located in the package cavity;

processing the second conducting through hole column on the last interconnecting circuit layer and processing a second sacrificial metal column on the protective metal to obtain a semi-finished device encapsulation layer;

laminating and thinning the semi-finished device encapsulation layer; and removing the second sacrificial metal column and the protective metal through etching to form the package cavity.

According to some embodiments of the disclosure, the packaging a chip in the package cavity includes:

mounting the chip in the package cavity, and connecting a pin of the chip to the interconnecting circuit located in the package cavity; and plastic encapsulating the package cavity.

According to some embodiments of the disclosure, the packaging a chip in the package cavity includes:

mounting the chip in the package cavity, and making a pin of the chip face a side away from the interconnecting circuit layer; and plastic encapsulating the package cavity.

According to some embodiments of the disclosure, the processing a second metal layer based on the device encapsulation layer includes:

exposing the pin of the chip through laser drilling; and processing the second metal layer based on the device encapsulation layer through pattern transfer and pattern plating, and connecting the second metal layer to the pin of the chip.

According to some embodiments of the disclosure, the processing a sidewall antenna circuit on an inner wall of the groove includes:

processing a metal seed layer on the inner wall of the groove;

processing a photo mask film on the first metal layer and the second metal layer, and opening a window at a position of the photo mask film corresponding to the groove;

depositing metal in the groove to form the sidewall antenna circuit; and removing the photo mask film and the metal seed layer.

According to some embodiments of the disclosure, the inner wall of the groove has a step structure.

According to some embodiments of the disclosure, before the processing a conductive pin on the outer-layer circuit, the method further includes:

processing a solder resist layer on the outer-layer circuit, and opening a window at a position of the solder resist layer corresponding to the conductive pin.

The additional aspects and advantages of the disclosure are partially provided in the following description and partially become obvious from the following description or understood through the practice of the disclosure.

BRIEF DESCRIPTION OF DRAWINGS

The foregoing and/or additional aspects and advantages of the disclosure will be apparent and easily comprehensible from the description of the embodiments with reference to the accompanying drawings, in which.

DETAILED DESCRIPTION

The embodiments of the disclosure are described below in detail. Examples of the embodiments are shown in the accompanying drawings. The same or similar numerals represent the same or similar elements or elements having the same or similar functions throughout the specification. The embodiments described below with reference to the accompanying drawings are exemplary, and are only used to explain the disclosure but should not be construed as a limitation to the disclosure.

In the description of the disclosure, "several" means one or more, "a plurality of" means more than two, "greater than a number", "less than a number", "exceed a number" and the like indicate that the number is excluded, and "above a number", "below a number", "within a number", and the like indicate that the number is included. "First" and "second" are only used to distinguish between technical features but cannot be used to indicate or imply relative importance or implicitly specify a quantity of indicated technical features or implicitly specify a sequential relationship of indicated technical features.

In the description of the disclosure, unless otherwise expressly defined, the terms such as "disposed", "mounted", and "connected" should be understood in a broad sense. For persons of ordinary skill in the art, specific meanings of the terms in the disclosure may be appropriately determined with reference to the specific content in the technical solution.

Figure 16:
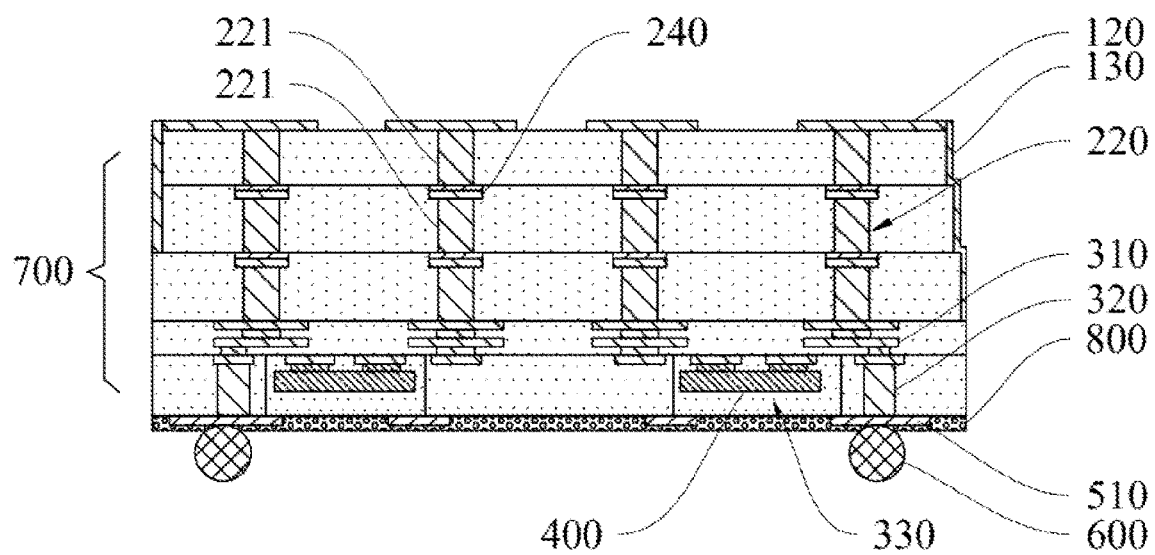
FIG. 16 is a schematic structural diagram of a packaging structure with an antenna according to an embodiment of the disclosure.
Figure 17:
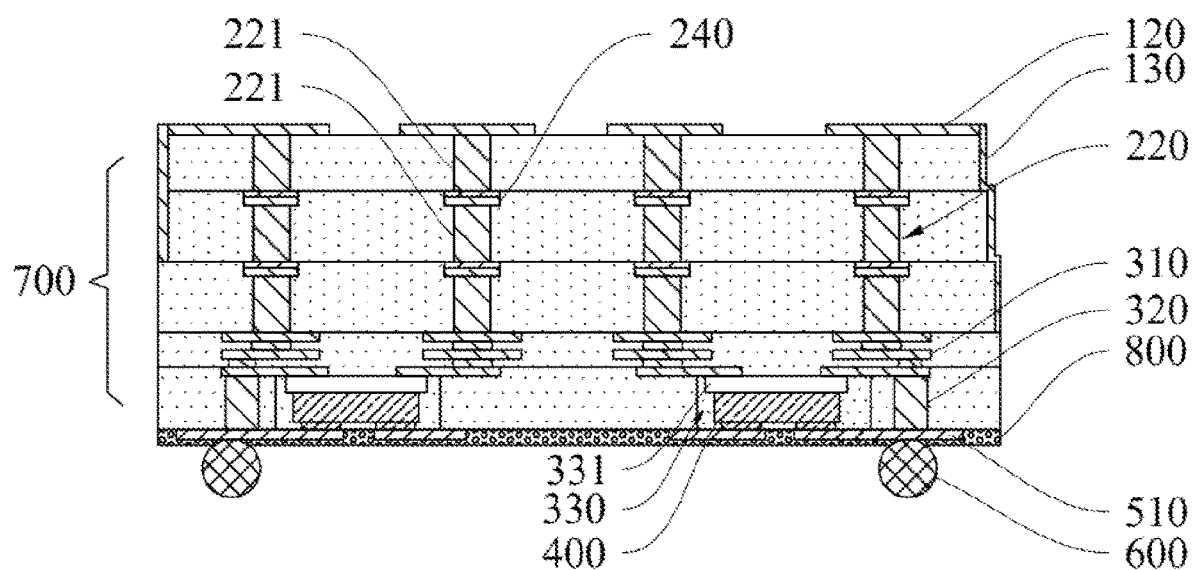
FIG. 17 is another schematic structural diagram of a packaging structure with an antenna according to an embodiment of the disclosure.

Referring to FIG. 16 and FIG. 17, this embodiment discloses a packaging structure with an antenna, including a package 700, an antenna circuit, an interconnecting circuit 310, an outer-layer circuit 510, and a chip 400. The package 700 is internally packaged with a first conducting through hole column 220 and a second conducting through hole column 320. The antenna circuit includes a surface antenna circuit 120 and a sidewall antenna circuit 130. The surface antenna circuit 120 is disposed on a first surface of the package 700. The sidewall antenna circuit 130 is disposed on a sidewall of the package 700. The interconnecting circuit 310 is packaged in the package 700, and is connected to the antenna circuit by the first conducting through hole column 220. The outer-layer circuit 510 is disposed on a second surface of the package 700, and is connected to the interconnecting circuit 310 by the second conducting through hole column 320. The outer-layer circuit 510 is further connected to a conductive pin 600. The chip 400 is packaged in the package 700, and is connected to the interconnecting circuit 310 or the outer-layer circuit 510. It needs to be noted that the interconnecting circuit 310 is disposed on an inter-connecting circuit layer, there may be one or more inter-connecting circuit layers, and adjacent interconnecting circuit layers are connected by a third conducting through hole column.

In this embodiment, the antenna circuit is arranged on the first surface and the sidewall of the package 700, so that a wiring space of the package 700 can be fully utilized, which helps to arrange more antenna circuits and extend the length of an antenna and turns the antenna circuit of a single surface into that of a plurality of three-dimensional surfaces, thereby improving the signal transmission quality of the antenna circuit. In addition, in this embodiment, the antenna circuit and the chip 400 are integrally packaged, so that the package 700 is thinner and lighter.

During application, to fully utilize a wiring space on the sidewall of the package 700, the sidewall of the package 700 is divided into a plurality of areas vertically distributed in a step form. Correspondingly, the antenna circuit located on the sidewall of the package 700 has a step structure, which helps to further extend the length of the antenna circuit, thereby improving the signal transmission quality of the antenna circuit.

Continuing to refer to FIG. 16 or FIG. 17, the first conducting through hole column 220 includes a plurality of vertically connected inter-layer through hole columns 221. A pad 240 is disposed between two adjacent inter-layer through hole columns 221. The pad 240 is used for connecting the two adjacent inter-layer through hole columns 221, to facilitate the processing of the inter-layer through hole columns 221.

To further fully utilize the wiring space of the package 700, an inner-layer antenna circuit is disposed in the package 700 and is located in the same layer as the pad 240, and the inner-layer antenna circuit is connected to the corresponding pad 240, so that multilayer wiring and three-dimensional wiring of the antenna circuit can be implemented, which helps to extend the length of the antenna circuit, thereby improving the signal transmission quality of the antenna circuit.

To further understand the technical solution of the packaging structure with an antenna in this embodiment, embodiments of the disclosure further disclose a method for manufacturing an embedded substrate.

A method for manufacturing a packaging structure with an antenna includes the following steps.

Figure 1:
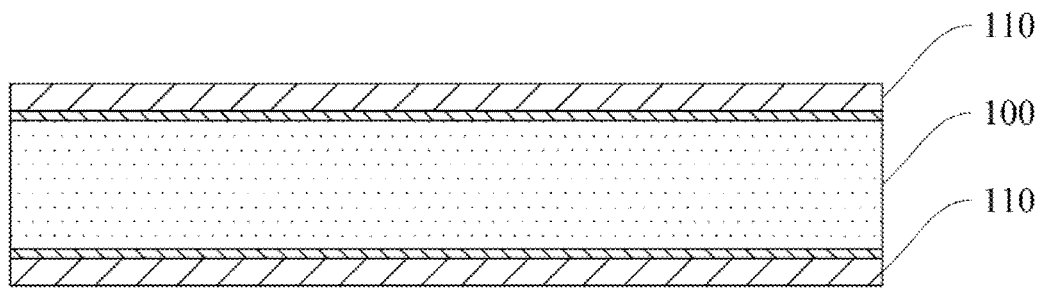
FIG. 1 to FIG. 15 are schematic structural sectional views of a substrate in intermediate processes of a method for manufacturing a packaging structure with an antenna according to an embodiment of the disclosure.
Figure 2:
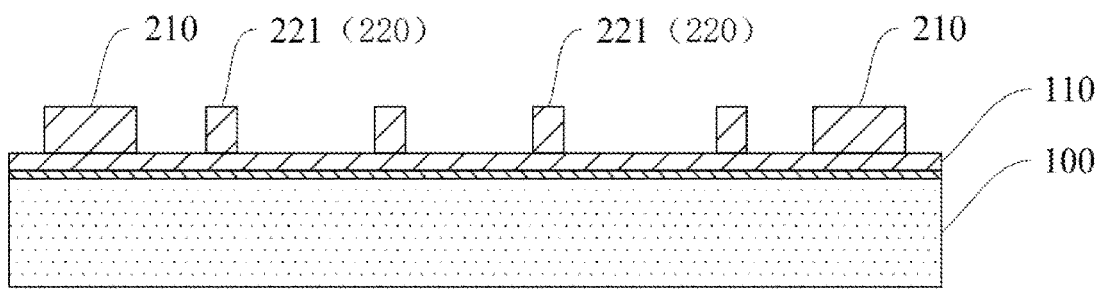
Figure 3:
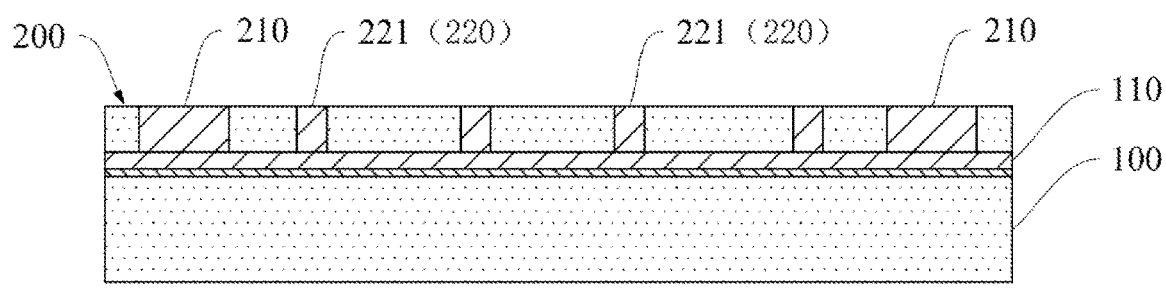

At S100, a bearing plate 100 having a first metal layer 110 is provided, and at least one antenna layer 200 is processed on the first metal layer 110, referring to FIG. 1, FIG. 2, and FIG. 3. A first sacrificial metal column 210 and a first conducting through hole column 220 connected to the first metal layer 110 are packaged in the antenna layer 200.

In this embodiment, the bearing plate 100 may use a copper clad plate attached with a removable copper foil on a surface. The copper foil on the surface of the copper clad plate is the first metal layer 110. It needs to be noted that the copper clad plate may be a single-sided copper clad plate or a double-sided copper clad plate. To facilitate the description of the manufacturing method in this embodiment, one side of a double-sided copper clad plate is used as an example for description in this embodiment. However, it should be understood that symmetric manufacturing may be performed on copper foils on two sides of a double-sided copper clad plate during actual production. In this embodiment, the first metal layer 110 is used for processing the subsequent surface antenna circuit 120. The antenna circuit is located on the antenna layer 200. According to actual application requirements, there may be one or more antenna layers 200. The first sacrificial metal column 210 in the antenna layer 200 facilitates forming a groove 230 when it is subsequently removed and facilitates subsequent processing of the sidewall antenna circuit 130. It needs to be noted that the antenna circuit in this embodiment includes the surface antenna circuit 120 and the sidewall antenna circuit 130, so that the antenna circuit can be turned from conventional single-surface wiring into three-dimensional multi-surface wiring, which helps to fully utilize a limited wiring space, arrange more antenna circuits, and extend the length of an antenna, thereby improving the signal transmission quality of the antenna circuit. The first conducting through hole column 220 is used for implementing interconnection between the antenna circuit and other circuits. It should be understood that the length of the first conducting through hole column 220 may be adaptively adjusted according to a quantity of antenna layers 200.

The foregoing step S100 of processing at least one antenna layer 200 on the first metal layer 110 includes the following steps.

At S110, a first section of an inter-layer through hole column 221 and a first section of the first sacrificial metal column 210 are processed on the first metal layer 110 through pattern transfer and pattern plating according to means of production to obtain a first semi-finished antenna layer.

It should be understood that pattern transfer and pattern plating are both common knowledge in the art. Details are no longer described in this embodiment.

At S120, the first semi-finished antenna layer is laminated to obtain the first antenna layer 200, referring to FIG. 2 and FIG. 3. A material for lamination uses a dielectric material having a low dielectric constant and a low loss. The dielectric material covers the inter-layer through hole column 221 and the first sacrificial metal column 210. After lamination, the dielectric material wraps the inter-layer through hole column 221 and the first sacrificial metal column 210 on an inner side to implement packaging, fixation, and protection of the inter-layer through hole column 221 and the first sacrificial metal column 210.

According to actual application requirements, there is one or more antenna layers 200. When there is one antenna layer 200, a single section of the inter-layer through hole column 221 is the first conducting through hole column 220 and may be used for connecting the subsequent antenna circuit and interconnecting circuit. When a plurality of antenna layers 200 need to be processed, the foregoing step S100 of processing at least one antenna layer 200 on the first metal layer 110 further includes the following steps.

At S130, a thinning process is performed. The laminated antenna layer 200 is thinned to expose a previous section of the inter-layer through hole column 221 and a previous section of the first sacrificial metal column 210, to implement inter-layer interconnection. A mechanical grinding plate is used in the thinning processing.

At S140: a patterning process is performed. A pad 240 is added on the previous section of the inter-layer through hole column 221 and the previous section of the first sacrificial metal column 210 through pattern transfer. Alternatively, a pad 240 and an inner-layer antenna circuit are added on the previous section of the inter-layer through hole column 221 and the previous section of the first sacrificial metal column 210 through pattern transfer, referring to FIG. 4. The inner-layer antenna circuit is connected to the corresponding pad 240. It needs to be noted that the position of the pad 240 may be set according to the requirement of means of production. The pad 240 may only be disposed on the inter-layer through hole column 221, or the pad 240 is disposed on the inter-layer through hole column 221 and a part of the first sacrificial metal column 210. The pad 240 may increase a contact area between two adjacent sections of the inter-layer through hole column 221 or the first sacrificial metal column 210, to facilitate processing of the two adjacent sections of the inter-layer through hole column 221 or the first sacrificial metal column 210.

At S150, a semi-finished product processing is performed. A next section of the inter-layer through hole column 221 and a next section of the first sacrificial metal column 210 are processed based on the pad 240 through pattern transfer and pattern plating according to means of production to obtain a next semi-finished antenna layer, referring to FIG. 5. It needs to be noted that the first conducting through hole column 220 in this step includes a plurality of sections of the inter-layer through hole column 221 and the pad 240 connected between two adjacent sections of the inter-layer through hole column 221. A quantity of sections of the first sacrificial metal column 210 may be less than a quantity of sections of the inter-layer through hole column 221. That is, the first sacrificial metal column 210 may be processed in a part or all of the antenna layer 200.

At S160, a lamination process is performed. The next semi-finished antenna layer is laminated.

Figure 4:
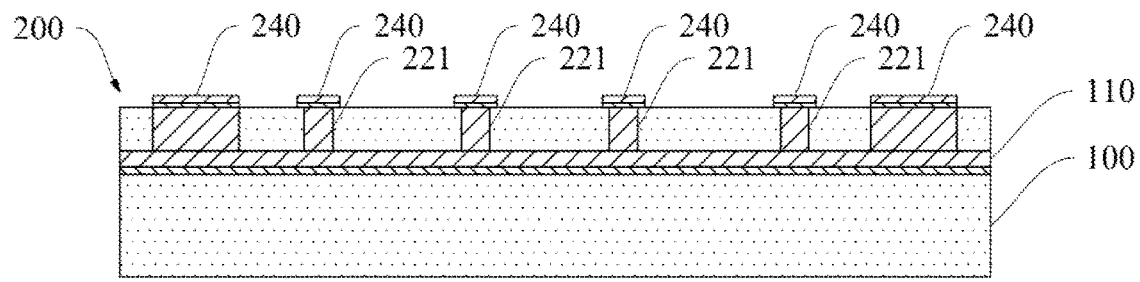
Figure 5:
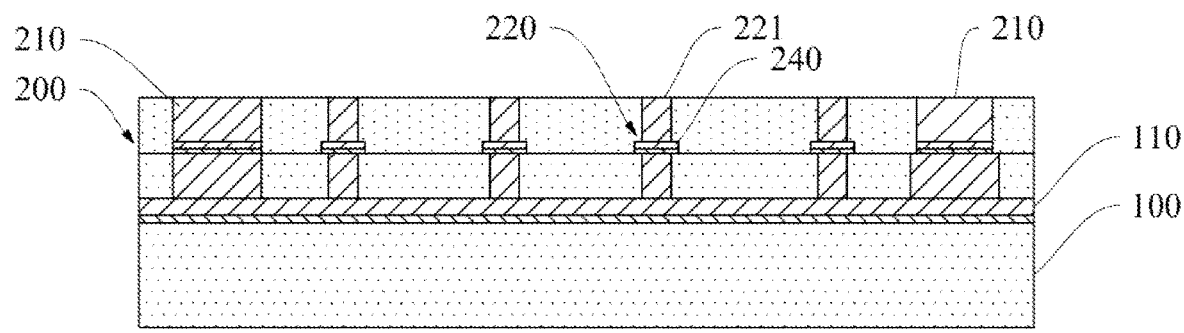
Figure 6:
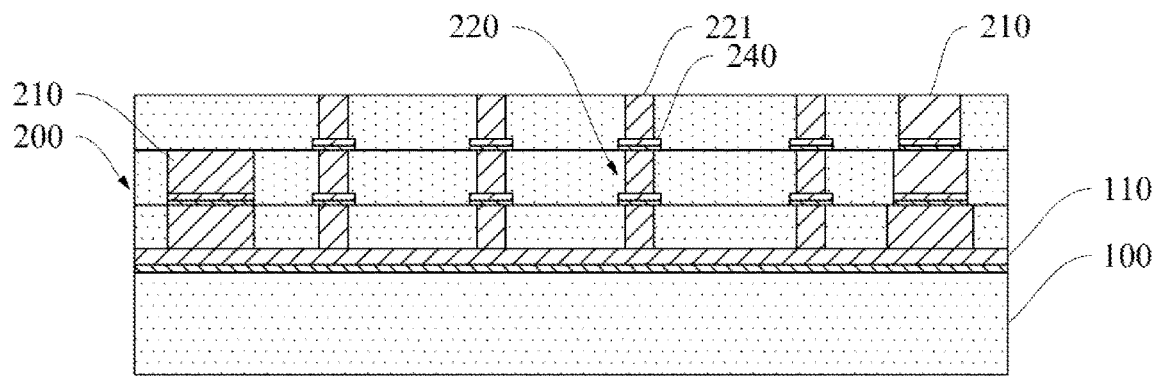
Figure 7:
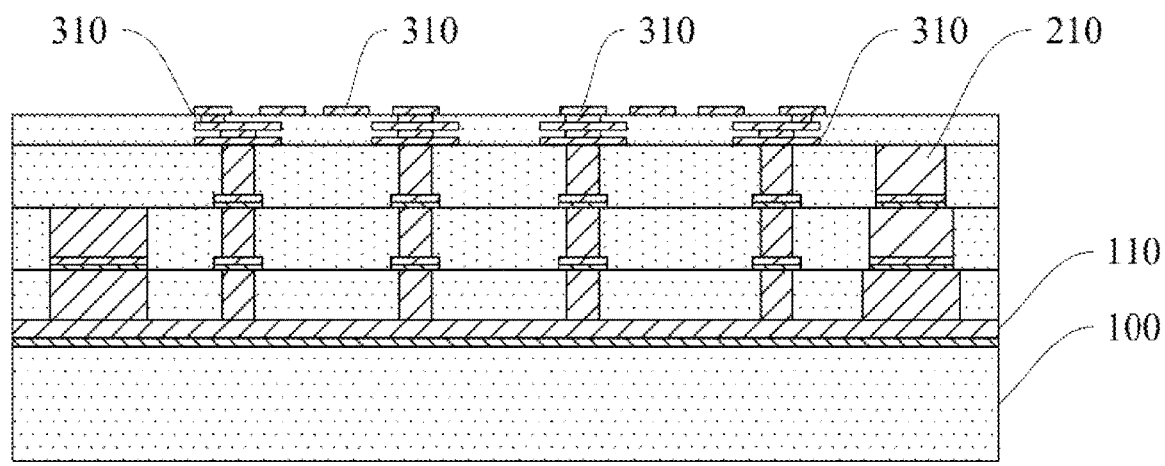

At S170, the plate grinding, patterning, semi-finished product processing, and lamination processes are repeating according to means of production until processing of a plurality of antenna layers 200 is completed, referring to FIG. 4, FIG. 5, and FIG. 6.

At S200, a device encapsulation layer 300 is processed based on the last antenna layer 200, referring to FIG. 6 to FIG. 10. The device encapsulation layer 300 includes an interconnecting circuit 310, a second conducting through hole column 320, and a package cavity 330. The second conducting through hole column 320 is connected to the interconnecting circuit 310.

The package cavity 330 is used for mounting and packaging the chip 400 in subsequent steps. The second conducting through hole column 320 is used for implementing an inter-layer connection between the interconnecting circuit 310 and the subsequent outer-layer circuit 510. The interconnecting circuit 310 and the chip 400 are directly or indirectly connected to each other, to implement signal transmission.

Step S200 of processing a device encapsulation layer 300 based on the last antenna layer 200 includes the following steps.

At S210, the last antenna layer 200 is thinned to expose metal in the antenna layer 200, for example, the inter-layer through hole column 221 or the first sacrificial metal column 210, referring to FIG. 6. A grinding plate is used in the thinning process.

At S220, at least one interconnecting circuit layer is processed on the thinned antenna layer 200 through pattern transfer, pattern plating, and lamination. The interconnecting circuit 310 is located on the interconnecting circuit layer, referring to FIG. 7. Interconnecting circuits 310 of two adjacent interconnecting circuit layers are connected by a third conducting through hole column.

According to different design requirements, the chip 400 may be directly connected to the interconnecting circuit 310, or connected to the outer-layer circuit 510, and indirectly connected to the interconnecting circuit 310 by the outer-layer circuit 510.

Figure 8:
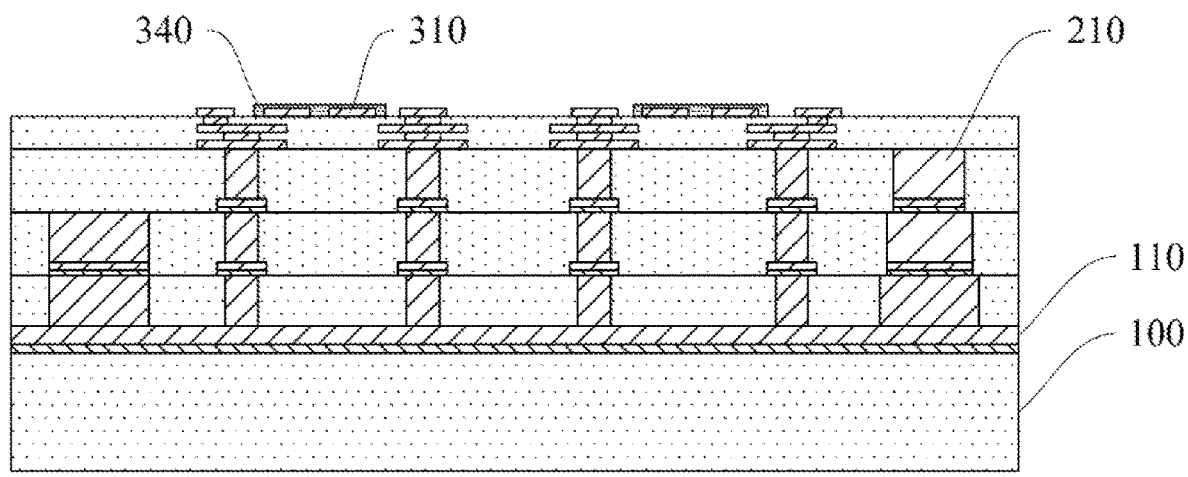

Referring to FIG. 8, for the manner in which the chip 400 is directly connected to the interconnecting circuit 310, Step S200 of processing a device encapsulation layer 300 based on the last antenna layer 200 further includes the following steps.

At S230, a protective metal 340 is processed on the interconnecting circuit 310 on the last interconnecting circuit layer and located in the package cavity 330. The interconnecting circuit 310 located in the package cavity 330 is used as a pad connected to the chip 400. To protect the pad during the formation of the package cavity 330, the protective metal 340 is deposited on the pad, and the protective metal 340 covers a pad area to implement protection of the pad. The protective metal 340 may be nickel, titanium or the like.

Figure 9:
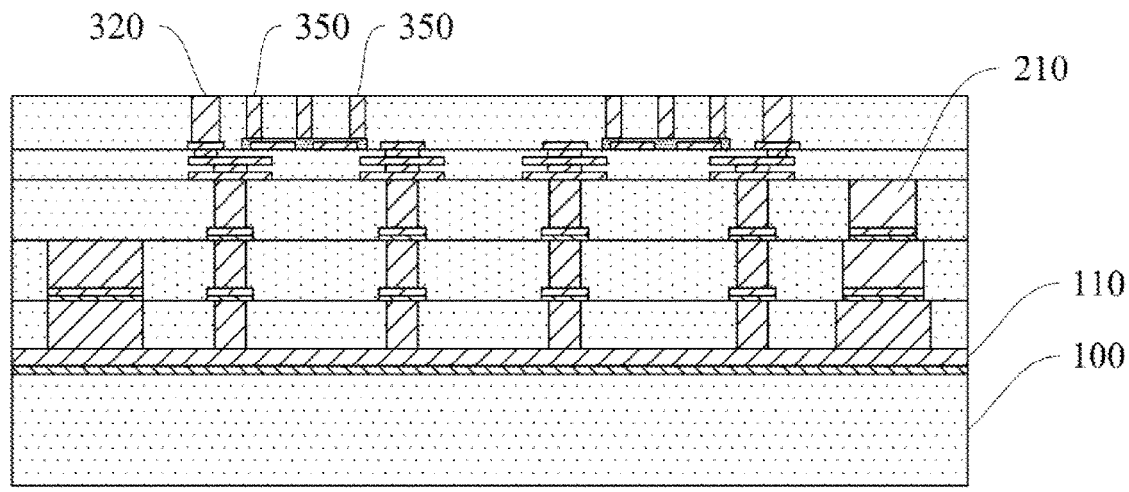

At S240, the second conducting through hole column 320 is processed on the last interconnecting circuit layer and a second sacrificial metal column 350 is processed on the protective metal 340 to obtain a semi-finished device encapsulation layer, referring to FIG. 9. The second conducting through hole column 320 and the second sacrificial metal column 350 are obtained from processing through pattern transfer and pattern plating according to means of production, so that a connection between the interconnecting circuit 310 and the subsequent outer-layer circuit 510 can be implemented.

At S250, the semi-finished device encapsulation layer is laminated and thinned to expose metal on a surface of the device encapsulation layer 300.

Figure 10:
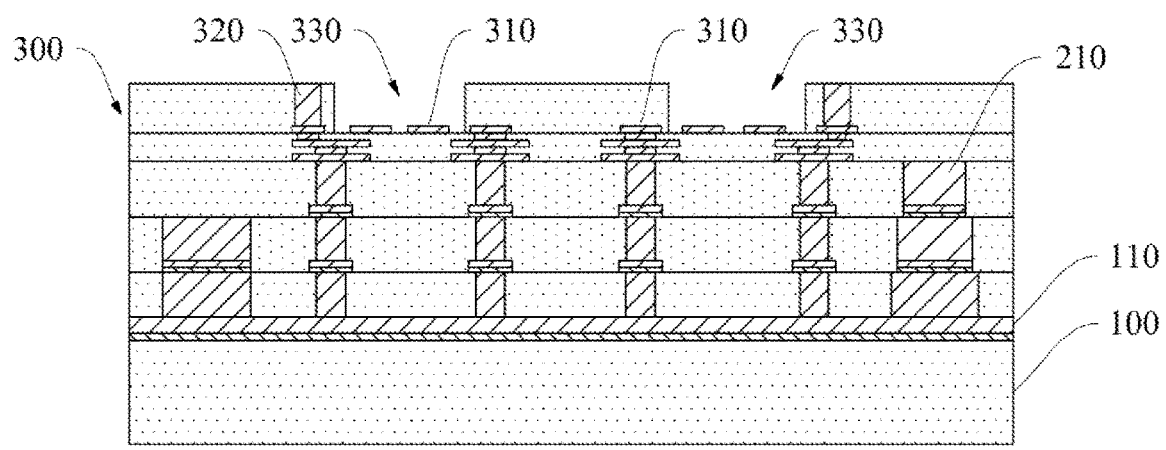

At S260, the second sacrificial metal column 350 and the protective metal 340 is removed through etching to form the package cavity 330, referring to FIG. 10. The interconnecting circuit 310 located in the package cavity 330 may be used as the pad connected to the chip 400 after the protective metal 340 is removed.

Figure 11:
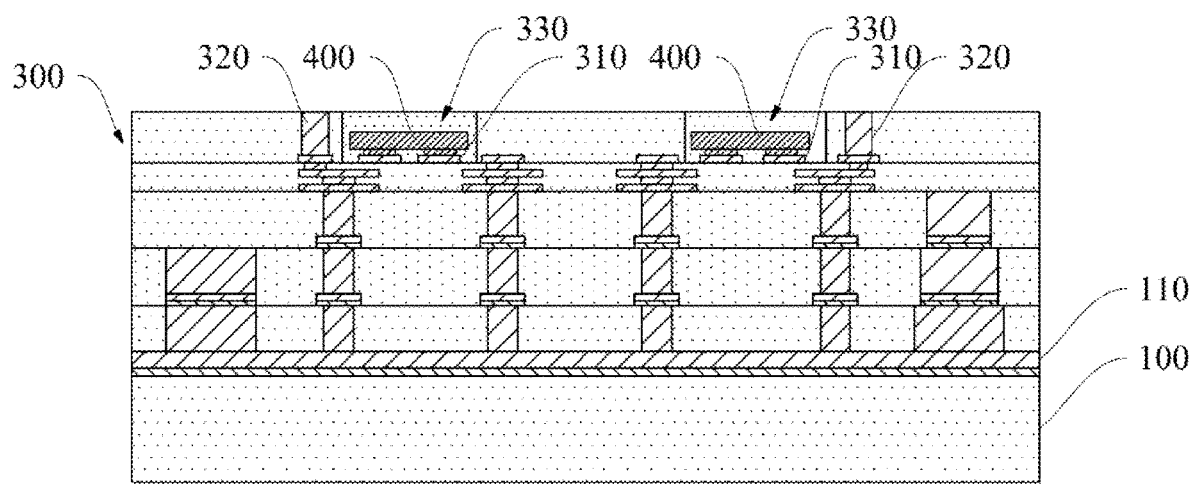
Figure 12:
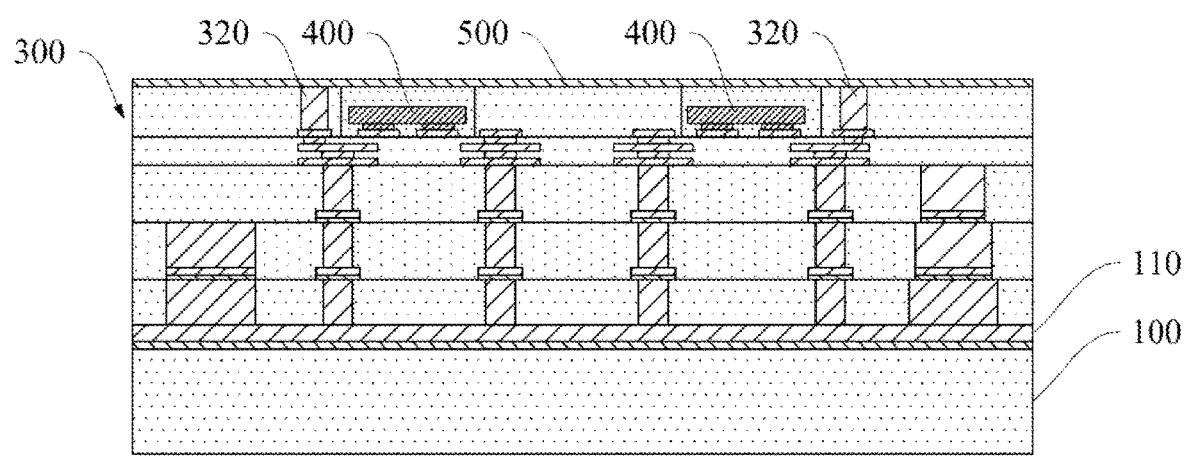

At S300, a chip 400 is packaged in the package cavity 330, and a second metal layer 500 processed based on the device encapsulation layer 300, referring to FIG. 11 and FIG. 12.

The package cavity 330 is disposed in the device encapsulation layer 300 obtained from processing at Step S205. After the chip 400 is packaged in the package cavity 330, to facilitate manufacturing of the outer-layer circuit 510, the second metal layer 500 is processed based on the device encapsulation layer 300.

For the manner in which the chip 400 is directly connected to the interconnecting circuit 310, Step S300 of packaging a chip 400 in the package cavity 330 includes the following steps.

At S310a, the chip 400 is mounted in the package cavity 330, and a pin of the chip 400 is connected to the interconnecting circuit 310 located in the package cavity 330, referring to FIG. 11.

At S320a, the package cavity 330 is plastic encapsulated to fill a packaging material in the package cavity 330, so as to encapsulate and fix the chip 400.

Figure 13:
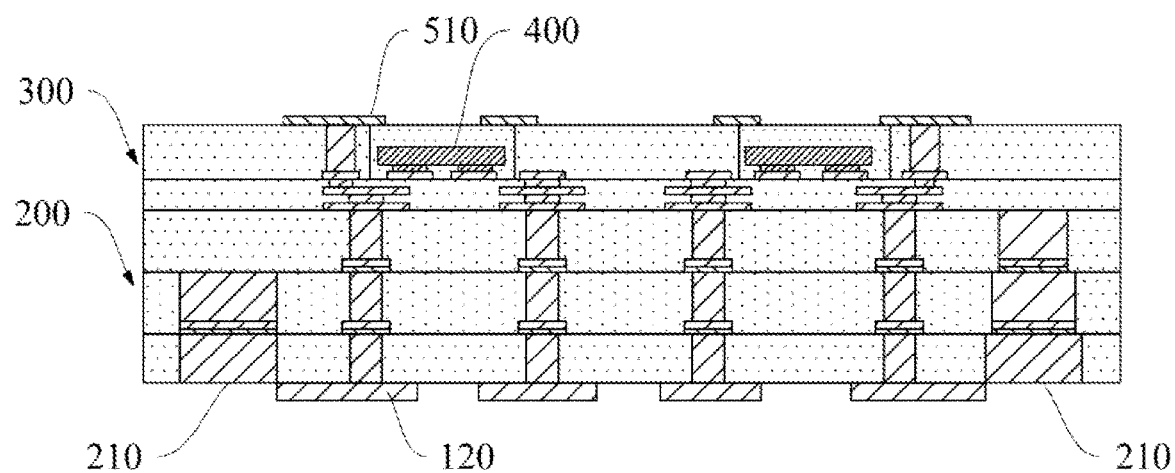

At S400, a plate separation process is performed, the first metal layer 110 is processed into a surface antenna circuit 120, and the second metal layer 500 is processed into an outer-layer circuit 510, referring to FIG. 12 and FIG. 13.

After processing of the second metal layer 500 is completed, the bearing plate 100 is removed to expose the first metal layer 110, to facilitate manufacturing of the surface antenna circuit 120. In this embodiment, manufacturing of the surface antenna circuit 120 and manufacturing of the outer-layer circuit 510 may both use processing through pattern transfer and pattern plating according to means of production. Pattern transfer and pattern plating are both common knowledge in the art. Details are no longer described in this embodiment.

Figure 14:
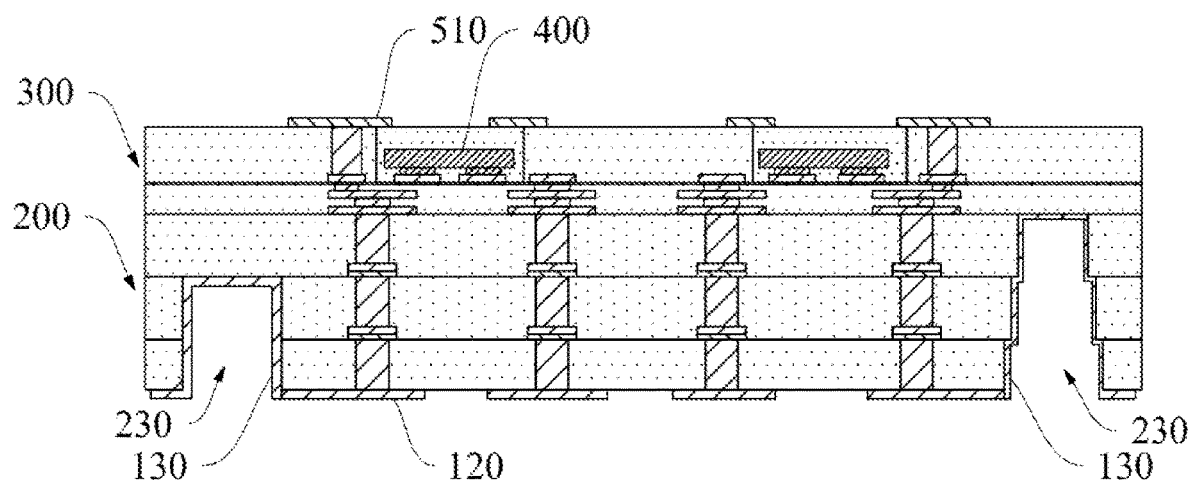

At S500, the first sacrificial metal column 210 is removed to obtain a groove 230, referring to FIG. 13 and FIG. 14.

To process the sidewall antenna circuit 130, the first sacrificial metal column 210 may be removed through etching to obtain the groove 230. An inner wall of the groove 230 provides support for the sidewall antenna circuit 130.

At S600, a sidewall antenna circuit 130 is processed on an inner wall of the groove 230, referring to FIG. 14. The sidewall antenna circuit 130 is connected to the surface antenna circuit 120.

Step S600 of processing a sidewall antenna circuit 130 on an inner wall of the groove 230 includes the following steps.

At S610, a metal seed layer is processed on the inner wall of the groove 230, to increase the bonding force between the inner wall of the groove 230 and the subsequent sidewall antenna circuit 130. The metal seed layer may be processed through sputtering.

At S620, a photo mask film is processed on the first metal layer 110 and the second metal layer 500, and a window is opened at a position of the photo mask film corresponding to the groove 230, to expose the groove 230.

At S630, metal is deposited in the groove 230 to form the sidewall antenna circuit 130.

At S640, the photo mask film and the metal seed layer are removed.

According to actual application requirements, the inner wall of the groove 230 is of a flat structure or a step structure. Correspondingly, the antenna circuit located on the sidewall of the package 700 has a step structure, which helps to further extend the length of the antenna circuit, thereby improving the signal transmission quality of the antenna circuit.

At S700, a conductive pin 600 is processed on the outer-layer circuit 510.

Figure 15:
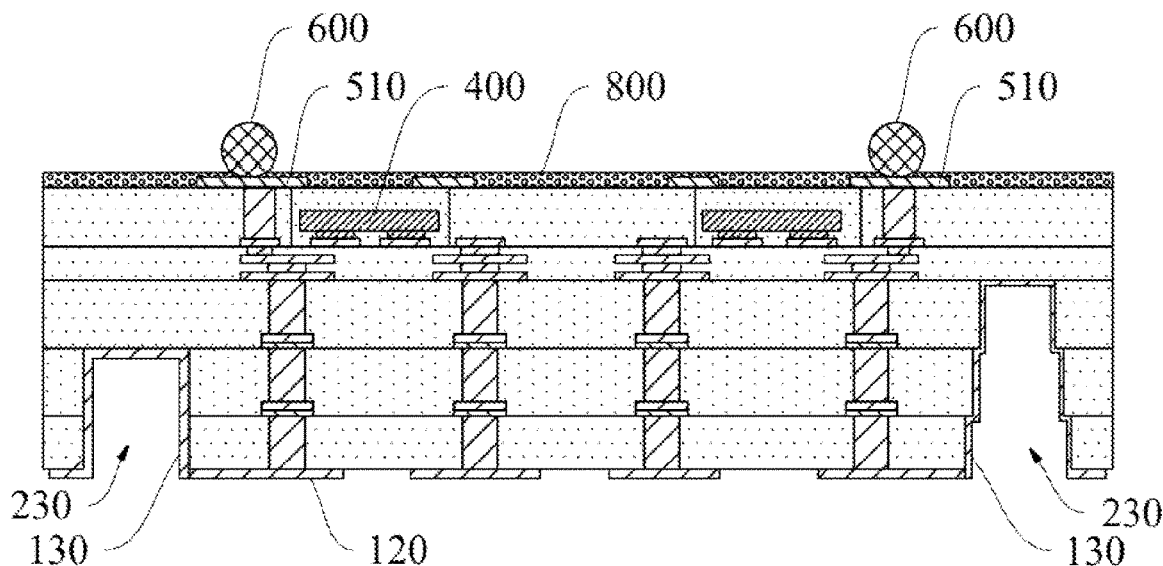

Referring to FIG. 15, before Step S700 of processing a conductive pin 600 on the outer-layer circuit 510, the method further includes the following steps. At S701, a solder resist layer 800 is processed on the outer-layer circuit 510, and a window is opened at a position of the solder resist layer 800 corresponding to the conductive pin 600. The solder resist layer 800 is processed on the outer-layer circuit 510, so that the outer-layer circuit 510 can be protected. A window is opened in the solder resist layer 800, so that a pad of the conductive pin 600 can be exposed, to facilitate processing of the conductive pin 600.

At S800, a cutting process is performed along the groove 230 to obtain a package 700, referring to FIG. 15 and FIG. 16.

In the manufacturing method in this embodiment, the antenna circuit is arranged on the surface and the sidewall of the package 700, so that a wiring space of the package 700 can be fully utilized, which helps to arrange more antenna circuits and extend the length of an antenna and turns the antenna circuit from a single surface into a plurality of three-dimensional surfaces, thereby improving the signal transmission quality of the antenna circuit. In addition, in this embodiment, the antenna circuit and the chip 400 are integrally packaged, so that the package 700 is thinner and lighter.

Referring to FIG. 17, for the manner in which the chip 400 is connected to the outer-layer circuit 510, Step S300 of packaging a chip 400 in the package cavity 330 includes the following steps.

At S310b, the chip 400 is mounted in the package cavity 330, and a pin of the chip 400 faces a side away from the interconnecting circuit layer. It needs to be noted that during mounting of the chip 400, the chip 400 may be fixed in the package cavity 330 through an adhesive material 331. The adhesive material 331 may use a conductive silver paste, a die attach film (DAF) or the like.

At S320b, the package cavity 330 is plastic encapsulated.

For the manner in which the chip 400 is connected to the outer-layer circuit 510, Step S300 of processing a second metal layer 500 based on the device encapsulation layer 300 includes the following steps.

At S330, the pin of the chip 400 is exposed through laser drilling.

At S340, the second metal layer 500 is processed based on the device encapsulation layer 300 through pattern transfer and pattern plating, and the second metal layer 500 is connected to the pin of the chip 400. After the second metal layer 500 is processed into the outer-layer circuit 510, it may be implemented that the chip 400 is connected to the outer-layer circuit 510. It needs to be noted that the pin of the chip 400 may be connected to the outer-layer circuit by a copper column 510. The copper column may be obtained through pattern plating during processing of the outer-layer circuit 510.

The embodiments of the disclosure are described above in detail with reference to the accompanying drawings. However, the disclosure is not limited to the foregoing embodiments. Within the knowledge of a person of ordinary skills in the art, various changes may further be made without departing from the gist of the disclosure.

What is claimed is:

1. A packaging structure with an antenna, comprising:
    a package, internally packaged with a first conducting through hole column and a second conducting through hole column;
    an antenna circuit, disposed on a first surface and a sidewall of the package and at least partially covering the first surface and the sidewall of the package;
    an interconnecting circuit, packaged in the package, and connected to the antenna circuit by the first conducting through hole column;
    an outer-layer circuit, disposed on a second surface of the package, and connected to the interconnecting circuit by the second conducting through hole column, the outer-layer circuit being further connected to a conductive pin; and
    a chip, packaged in the package, and connected to the interconnecting circuit or the outer-layer circuit;
    wherein the antenna circuit located on the sidewall of the package has a step structure.

2. The packaging structure with an antenna of claim 1, wherein the first conducting through hole column comprises a plurality of vertically connected inter-layer through hole columns, and a pad is disposed between two adjacent inter-layer through hole columns.

3. The packaging structure with an antenna of claim 2, wherein an inner-layer antenna circuit is disposed in the package and is located in the same layer as the pad, and the inner-layer antenna circuit is connected to the corresponding pad.

4. A method for manufacturing a packaging structure with an antenna, comprising:
    providing a bearing plate having a first metal layer, and processing at least one antenna layer on the first metal layer, a first sacrificial metal column and a first conducting through hole column connected to the first metal layer being packaged in the antenna layer;
    processing a device encapsulation layer based on the last antenna layer, the device encapsulation layer comprising an interconnecting circuit, a second conducting through hole column, and a package cavity, the second conducting through hole column being connected to the interconnecting circuit;
    packaging a chip in the package cavity, and processing a second metal layer based on the device encapsulation layer;
    performing plate separation, processing the first metal layer into a surface antenna circuit, and processing the second metal layer into an outer-layer circuit;
    removing the first sacrificial metal column to obtain a groove;
    processing a sidewall antenna circuit on an inner wall of the groove, the sidewall antenna circuit being connected to the surface antenna circuit;
    processing a conductive pin on the outer-layer circuit; and
    performing cutting along the groove to obtain a package.

5. The method for manufacturing a packaging structure with an antenna of claim 4, wherein the processing at least one antenna layer on the first metal layer comprises:
    processing a first section of an inter-layer through hole column and a first section of the first sacrificial metal column on the first metal layer through pattern transfer and pattern plating according to means of production to obtain a first semi-finished antenna layer; and
    laminating the first semi-finished antenna layer to obtain a first antenna layer.

6. The method for manufacturing a packaging structure with an antenna of claim 5, wherein the processing at least one antenna layer on the first metal layer further comprises:
    thinning: thinning the laminated antenna layer to expose a previous section of the inter-layer through hole column and a previous section of the first sacrificial metal column;
    patterning: adding a pad on the previous section of the inter-layer through hole column and the previous section of the first sacrificial metal column through pattern transfer, or, adding a pad and an inner-layer antenna circuit on the previous section of the inter-layer through hole column and the previous section of the first sacrificial metal column through pattern transfer, the inner-layer antenna circuit being connected to the corresponding pad;
    semi-finished product processing: processing a next section of the inter-layer through hole column and a next section of the first sacrificial metal column based on the pad through pattern transfer and pattern plating according to means of production to obtain a next semi-finished antenna layer;
    lamination: laminating the next semi-finished antenna layer; and
    repeating plate grinding, patterning, semi-finished product processing, and lamination according to means of production until processing of a plurality of antenna layers is completed.

7. The method for manufacturing a packaging structure with an antenna of claim 4, wherein the processing a device encapsulation layer based on the last antenna layer comprises:
    thinning the last antenna layer; and
    processing at least one interconnecting circuit layer on the thinned antenna layer through pattern transfer, pattern plating, and lamination, the interconnecting circuit being located on the interconnecting circuit layer.

8. The method for manufacturing a packaging structure with an antenna of claim 7, wherein the processing a device encapsulation layer based on the last antenna layer further comprises:
    processing protective metal on the interconnecting circuit on the last interconnecting circuit layer and located in the package cavity;
    processing the second conducting through hole column on the last interconnecting circuit layer and processing a second sacrificial metal column on the protective metal to obtain a semi-finished device encapsulation layer;
    laminating and thinning the semi-finished device encapsulation layer; and
    removing the second sacrificial metal column and the protective metal through etching to form the package cavity.

9. The method for manufacturing a packaging structure with an antenna of claim 8, wherein the packaging a chip in the package cavity comprises:

mounting the chip in the package cavity, and connecting a pin of the chip to the interconnecting circuit located in the package cavity; and plastic encapsulating the package cavity.

10. The method for manufacturing a packaging structure with an antenna of claim 8, wherein the packaging a chip in the package cavity comprises:

mounting the chip in the package cavity, and making a pin of the chip face a side away from the interconnecting circuit layer; and plastic encapsulating the package cavity.

11. The method for manufacturing a packaging structure with an antenna of claim 10, wherein the processing a second metal layer based on the device encapsulation layer comprises:

exposing the pin of the chip through laser drilling; and processing the second metal layer based on the device encapsulation layer through pattern transfer and pattern plating, and connecting the second metal layer to the pin of the chip.

12. The method for manufacturing a packaging structure with an antenna of claim 4, wherein the processing a sidewall antenna circuit on an inner wall of the groove comprises:

processing a metal seed layer on the inner wall of the groove;

processing a photo mask film on the first metal layer and the second metal layer, and opening a window at a position of the photo mask film corresponding to the groove;

depositing metal in the groove to form the sidewall antenna circuit; and removing the photo mask film and the metal seed layer.

13. The method for manufacturing a packaging structure with an antenna of claim 4, wherein the inner wall of the groove has a step structure.

14. The method for manufacturing a packaging structure with an antenna of claim 4, wherein before the processing a conductive pin on the outer-layer circuit, the method further comprises:

processing a solder resist layer on the outer-layer circuit, and opening a window at a position of the solder resist layer corresponding to the conductive pin.

* * * * *